(12) United States Patent
Li et al.

(10) Patent No.: US 11,942,424 B2
(45) Date of Patent: Mar. 26, 2024

(54) VIA PATTERNING FOR INTEGRATED CIRCUITS

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Tsung-Sheng Kang, Ballston Lake, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 17/457,048

(22) Filed: Dec. 1, 2021

(65) Prior Publication Data
US 2023/0170298 A1 Jun. 1, 2023

(51) Int. Cl.
| | |
|---|---|
| *H01L 23/528* | (2006.01) |
| *H01L 21/762* | (2006.01) |
| *H01L 21/768* | (2006.01) |
| *H01L 23/532* | (2006.01) |
| *H01L 23/522* | (2006.01) |

(52) U.S. Cl.
CPC ...... *H01L 23/528* (2013.01); *H01L 21/76224* (2013.01); *H01L 21/76802* (2013.01); *H01L 21/76819* (2013.01); *H01L 23/53214* (2013.01); *H01L 23/53257* (2013.01); *H01L 23/5329* (2013.01); *H01L 21/7682* (2013.01); *H01L 23/5222* (2013.01)

(58) Field of Classification Search
CPC ............ H01L 23/528; H01L 21/76224; H01L 21/76802; H01L 21/76819; H01L 23/53214; H01L 23/53257; H01L 23/5329; H01L 21/76837; H01L 21/76885; H01L 23/5222; H01L 21/7682
See application file for complete search history.

(56) References Cited

U.S. PATENT DOCUMENTS

| | | | |
|---|---|---|---|
| 5,512,514 A | 4/1996 | Lee | |
| 5,691,238 A | 11/1997 | Avanzino | |
| 5,773,365 A | 6/1998 | Shinya | |
| 5,869,880 A * | 2/1999 | Grill | ............... H01L 21/7682 |
| | | | 257/508 |
| 6,143,640 A | 11/2000 | Cronin | |

(Continued)

FOREIGN PATENT DOCUMENTS

| | | |
|---|---|---|
| CN | 105852998 B | 8/2016 |
| EP | 0072297 B1 | 5/1985 |

(Continued)

*Primary Examiner* — Patricia D Valenzuela
(74) *Attorney, Agent, or Firm* — Douglas M. Crockatt (57) ABSTRACT

An interconnect structure and a method of forming the interconnect structure are provided. The interconnect structure includes one or more metal lines in direct contact with a top surface of one or more devices and one or more vias in direct contact with top surfaces of the one or more metal lines. The interconnect structure also includes one or more dielectric pillars in direct contact with the top surface of the one or more devices. A height of a top surface of the one or more dielectric pillars above the one or more devices is equal to a height of a top surface of the one or more vias above the one or more devices.

10 Claims, 10 Drawing Sheets

(56) References Cited

U.S. PATENT DOCUMENTS

| | | |
|---|---|---|
| 6,352,917 B1 | 3/2002 | Gupta |
| 6,495,917 B1 | 12/2002 | Ellis-Monaghan |
| 6,617,239 B1 | 9/2003 | Farrar |
| 7,067,902 B2 | 6/2006 | Hichri |
| 8,299,625 B2 | 10/2012 | Ponoth |
| 8,735,278 B2 | 5/2014 | Lee |
| 9,263,325 B1 | 2/2016 | Wei |
| 9,401,323 B1 | 7/2016 | Farooq |
| 9,490,168 B1 | 11/2016 | Chen |
| 9,548,243 B1 | 1/2017 | Briggs |
| 9,613,862 B2 | 4/2017 | Lenhardt |
| 9,673,095 B2 | 6/2017 | Farooq |
| 9,793,164 B2 | 10/2017 | Machkaoutsan |
| 9,852,986 B1 | 12/2017 | Stephens |
| 9,917,137 B1 | 3/2018 | Briggs |
| 10,079,173 B2 | 9/2018 | Xie |
| 10,177,031 B2 | 1/2019 | Bao |
| 11,101,175 B2 | 8/2021 | Mignot |
| 2002/155693 A1 | 10/2002 | Hong |
| 2008/0237789 A1 | 10/2008 | He |
| 2010/0052018 A1 | 3/2010 | Cohen |
| 2010/0264538 A1 | 10/2010 | Swinnen |
| 2013/0026606 A1 | 1/2013 | Farooq |
| 2013/0187273 A1 | 7/2013 | Zhang |
| 2015/0348832 A1 | 12/2015 | Bruce |
| 2018/0182810 A1* | 6/2018 | Yi .......................... H10B 61/10 |
| 2018/0269306 A1 | 9/2018 | Bao |
| 2019/0021176 A1* | 1/2019 | Law ..................... H05K 3/4038 |
| 2019/0206733 A1 | 7/2019 | Lin |

FOREIGN PATENT DOCUMENTS

| | | |
|---|---|---|
| TW | 322734 B | 4/2010 |
| WO | 2003100851 A1 | 12/2003 |

* cited by examiner

VIA PATTERNING FOR INTEGRATED CIRCUITS

BACKGROUND

This disclosure relates generally to integrated circuit fabrication and, more particularly, to interconnect devices.

Back end of line (BEOL) is the portion of integrated circuit fabrication where the individual devices (transistors, capacitors, resistors, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections. A via is an electrical connection between layers in a physical electronic circuit that goes through the plane of one or more adjacent layers. In integrated circuit design, a via is a small opening in an insulating oxide layer that allows a conductive connection between different layers.

SUMMARY

Embodiments relate to an interconnect structure and a method of forming the interconnect structure. According to one aspect, an interconnect structure is provided. The interconnect structure may include one or more metal lines in direct contact with a top surface of one or more devices and one or more vias in direct contact with top surfaces of the one or more metal lines. The interconnect structure also includes one or more dielectric pillars in direct contact with the top surface of the one or more devices. A height of a top surface of the one or more dielectric pillars above the one or more devices is equal to a height of a top surface of the one or more vias above the one or more devices.

According to another aspect, an interconnect structure is provided. The interconnect structure may include one or more metal lines and one or more vias in contact with the one or more metal lines. The interconnect structure may include one or more metal lines and one or more vias in direct contact with top surfaces of the one or more metal lines. The interconnect structure may include one or more dielectric pillars with a height of a top surface of the one or more dielectric pillars equal to a height of a top surface of the one or more vias. The interconnect structure may also include an ultra-low-k dielectric material in direct contact with side surfaces of the one or more metal lines, side surfaces of the one or more vias, and side surfaces of the one or more dielectric pillars.

According to another aspect, a method of forming an interconnect structure is provided. The method may include forming one or more metal lines on one or more devices and forming one or more vias on the one or more metal lines. One or more dielectric pillars may be formed on the one or more devices, and the one or more metal lines, the one or more vias, and the one or more dielectric pillars may be filled with an ultra-low-k dielectric material

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings:

FIGS. 1-9 illustrate the steps of a method of forming an interconnect structure, according to at least one embodiment;

The drawings are not necessarily to scale. The drawings are merely schematic representations, not intended to portray specific parameters. The drawings are intended to depict only typical embodiments. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments of this disclosure relate generally to integrated circuit fabrication and, more particularly, to interconnect devices. Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections. A via is an electrical connection between layers in a physical electronic circuit that goes through the plane of one or more adjacent layers. In integrated circuit design, a via is a small opening in an insulating oxide layer that allows a conductive connection between different layers.

In digital circuits, insulating dielectrics separate conducting components such as wire interconnects and transistors from one another. As the number of components in an integrated circuit have greatly increased and the size and pitch of components has decreased, capacitance between conductors increases in inverse proportion to the separation distance between conductors. Thus, traditional dielectric materials such as silicon dioxide have been replaced with low-k and ultra-low-k dielectric materials for improved device performance.

However, certain manufacturing processes such as chemical-mechanical planarization may cause surface defects for ultra-low-k layers. For example, "$V_x$" layer vias may have too low of a density to be an effective chemical-mechanical planarization stop. Thus, the chemical-mechanical planarization may remove more material than is desired, which may result in a non-flat surface of the integrated circuit device. It may be advantageous, therefore, to increase the density of features (e.g., metal lines and vias) within the integrated circuit to prevent the formation of surface defects, such as non-flat upper surfaces, based on forming dummy vias alongside the "$V_x$" layer vias that may act as a more effective chemical-mechanical planarization stop. One way to fabricate an integrated circuit with dummy vias is described in detail below by referring to the accompanying drawings FIGS. 1-9.

It is understood in advance that although example embodiments of this disclosure are described in connection with a particular transistor architecture, embodiments of this disclosure are not limited to the particular device architectures or materials described in this specification. Rather, embodiments of this disclosure are capable of being implemented in conjunction with any other type of transistor architecture or materials now known or later developed.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based integrated circuits are well known and so, in the interest of brevity, many conventional steps will only be mentioned briefly herein or will be omitted entirely without providing the well-known process details.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Turning now to an overview of technologies that are more specifically relevant to aspects of this disclosure, integrated circuits are fabricated in a series of stages, including a front-end-of-line (FEOL) stage, a middle-of-line (MOL) stage, and a BEOL stage. The process flows for fabricating modern integrated circuits are often identified based on whether the process flows fall in the FEOL stage, the MOL stage, or the BEOL stage. Generally, the FEOL stage is where device elements (e.g., transistors, capacitors, resistors) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the integrated circuit. Most integrated circuits need more than one layer of wires to form all the necessary connections, and as many as 5-12 layers are added in the BEOL process. The various BEOL layers are interconnected by vias that couple from one layer to another.

Insulating dielectric materials are used throughout the layers of an integrated circuit to perform a variety of functions, including stabilizing the integrated circuit structure and providing electrical isolation of the integrated circuit elements. For example, the metal interconnecting wires in the BEOL region of the integrated circuit are isolated by dielectric layers to prevent the wires from creating a short circuit with other metal layers.

As used herein, a "via" refers to the "$V_x$" layer via which electrically couples a line below (an "$M_x$" layer) and may also electrically couple to a line above (an "$M_{x+1}$" layer). Embodiments of this disclosure form an alternate metal via (e.g., Co, Ru) on the metal line below. There may be no barrier metal between the via and the line metal below. For ease of depiction, the metal lines and vias are illustrated herein as having a constant width. However, it may be appreciated that both the metal line and via may have a positive tapered angle such that the width narrows in an upward direction towards the top of the component (e.g., the width top of the via may be more narrow than the width at the bottom of the via).

Referring now to FIGS. 1-9, exemplary process steps of forming an interconnect device in accordance with one or more embodiments is shown and will now be described in greater detail below. It should be noted that FIGS. 1-9 all represent a cross section view of an integrated circuit structure 100 depicting the fabrication of an interconnect device.

Figure 1:
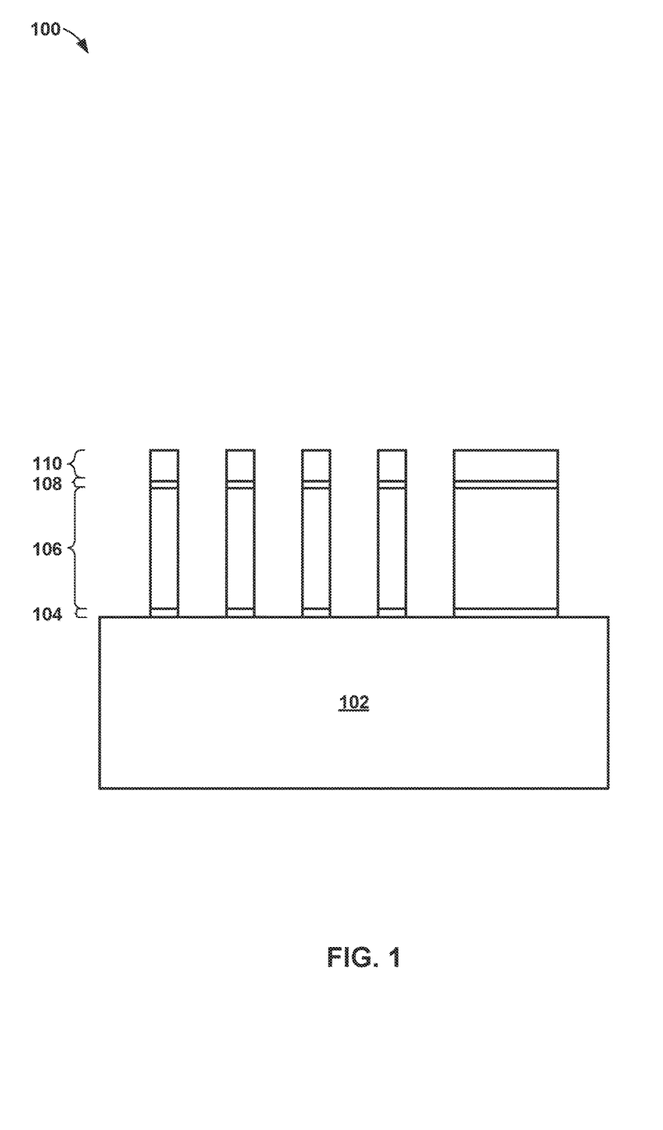
FIG. 1 depicts a cross-sectional view of a semiconductor structure after an initial set of processing operations, according to at least one embodiment.

Referring now to FIG. 1, a fabrication step of the integrated circuit structure 100, in accordance with one or more embodiments, is depicted. FIG. 1 depicts a cross-sectional view of a semiconductor structure after an initial set of processing operations. The integrated circuit structure 100 may include, among other things, an underneath device 102, a liner 104, a metal layer 106, an etch stop liner 108, and a hardmask 110.

The underneath device 102 may comprise either FEOL devices (e.g., transistors, capacitors, resisters), MOL, or additional BEOL metallization layers. The particular composition of the underneath device 102 may vary based on the type of device desired. For ease of description, the underneath device 102 is depicted as a single box in FIG. 1 for illustrative purposes. It may be appreciated that the area shown as the underneath device 102 may be substantially any combination of devices.

The liner 104 is formed on the underneath device 102 by physical vapor deposition (e.g., sputtering), chemical vapor deposition, or atomic layer deposition to form a thickness of about 0.5 nm to about 3 nm, although other thicknesses are within the contemplated scope of this disclosure. The liner 104 may be a conductor such as titanium nitride, titanium aluminum carbide, titanium carbide, or tantalum nitride. In some embodiments, the liner 104 may be comprised of other conductive materials such as aluminum, copper, nickel, cobalt, ruthenium, or combinations thereof.

Metal lines may be deposited as the metal layer 106 that is subsequently formed into metal lines as described below. The metal lines may be formed from any type of conductive metal. For example, the metal lines may be composed of ruthenium, copper, cobalt, molybdenum, tungsten, aluminum, or rhodium. The metal layer 106 may be deposited on the liner 104 using, for example, chemical vapor deposition, plasma enhanced chemical vapor deposition, physical vapor deposition, or other deposition processes. The metal layer 106 may be deposited to form a thickness of 20 to 200 nm, although other thicknesses are within the contemplated scope of this disclosure.

The etch stop liner 108 is deposited on the metal layer 106. The etch stop liner 108 may be formed from silicon nitride, silicon carbide, silicon carbonitride, hafnium oxide, or aluminum oxide. In general, the etch stop liner 108 may be a highly etch resistant material and may be formed from a dielectric or metal material. The etch stop liner 108 may be formed using a deposition process such as, for example, spin coating or atomic layer deposition, to form a thickness of about 0.5 nm to about 3 nm, although other thicknesses are within the contemplated scope of this disclosure.

The hardmask 110 is deposited on top of the etch stop liner 108. The hardmask 110 is composed of tetraethoxysilane (TEOS), titanium nitride, amorphous silicon, amorphous silicon germanium, or combinations thereof. In some embodiments, the hardmask 110 is formed to a thickness of 10 to 60 nm, although other thicknesses are within the contemplated scope of this disclosure. The hardmask 110 may be deposited using, for example, any suitable deposition process, such as chemical vapor deposition, plasma enhanced chemical vapor deposition, ultrahigh vacuum chemical vapor deposition, rapid thermal chemical vapor deposition, metalorganic chemical vapor deposition, low-pressure chemical vapor deposition, limited reaction processing chemical vapor deposition, atomic layer deposition, flowable chemical vapor deposition, spin-on dielectrics, physical vapor deposition, molecular beam epitaxy, chemical solution deposition, spin-on dielectrics, or other like process.

Subsequent to the formation of the liner 104, the metal layer 106, the etch stop liner 108, and the hardmask 110, the hardmask 110 may be patterned by removing portions of the hardmask 110 from the areas not protected by the pattern in a photoresist (not shown) using, for example, reactive ion etching. The hardmask 110 may be patterned such that the hardmask 110 protects the areas of the metal layer 106 that corresponds to desired locations of the metal lines.

Subsequent to patterning the hardmask 110, an etching process is performed to form metal lines. In general, an etching process, such as reactive ion etching, laser ablation, or any other etch process may be used to selectively remove portions of the etch stop liner 108, the metal layer 106, and the liner 104. As described above, the hardmask 110 may be patterned using a photoresist (not shown) to protect areas of the metal layer 106 where metal lines and vias are desired and the hardmask 110 may be utilized during the etching process in the creation of the metal lines. The etching process only removes the portions of the etch stop liner 108, the metal layer 106, and the liner 104 not protected by the hardmask 110 and the etching process stops at the underneath device 102.

Figure 2:
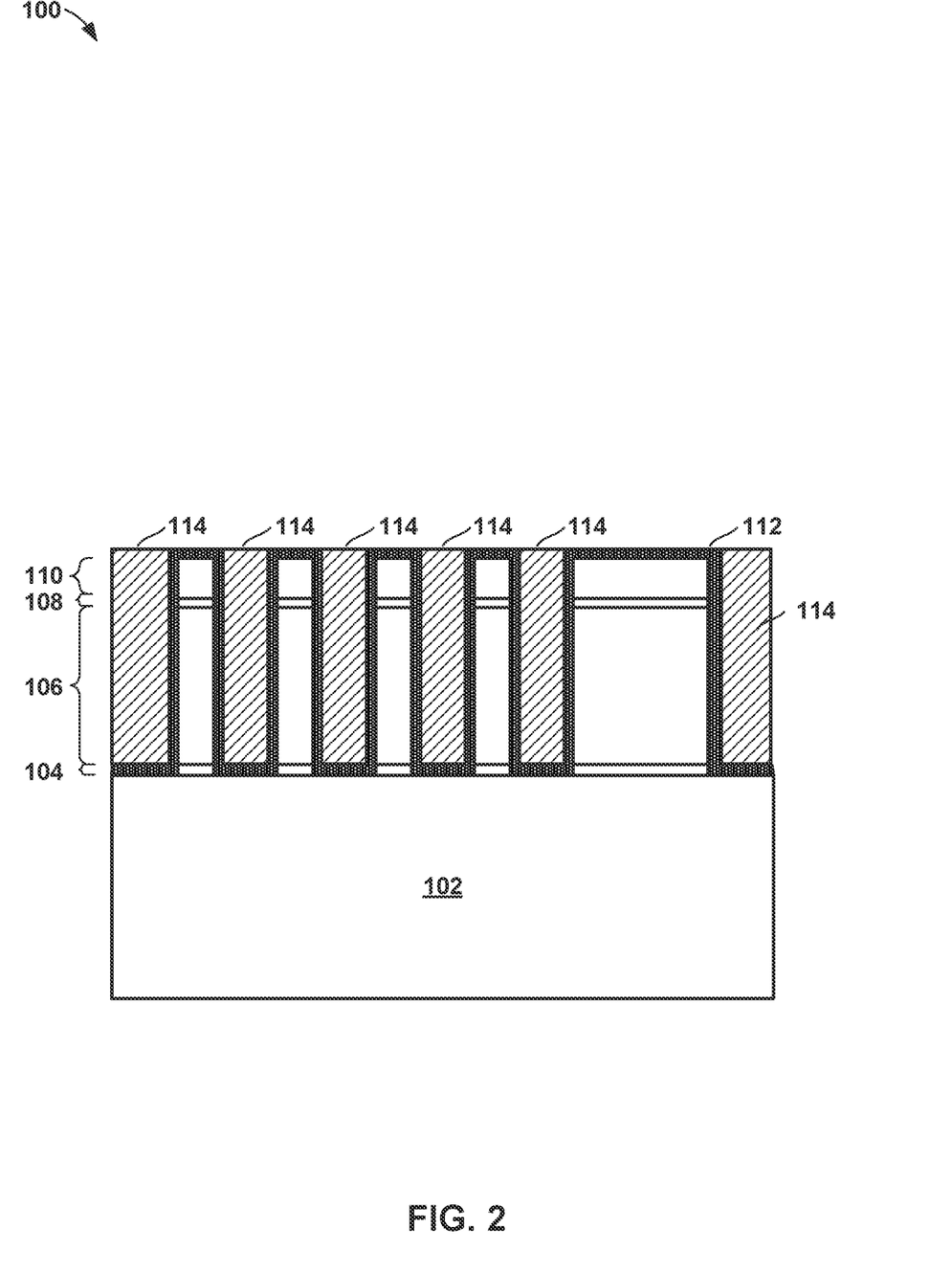
FIG. 2 depicts a cross-sectional view of a process of formation of a liner and interlayer dielectric (ILD) layer, according to at least one embodiment.

Referring now to FIG. 2, a fabrication step of the integrated circuit structure 100, in accordance with one or more embodiments, is depicted. FIG. 2 depicts the formation of a liner 112 and an interlayer dielectric layer 114. The liner 112 may be deposited on exposed top and sidewall surfaces of the integrated circuit structure 100. More particularly, the liner 112 may be deposited on exposed surfaces of the underneath device 102, the liner 104, the metal layer 106, the etch stop liner 108, and the hardmask 110. The liner 112 may be produced by forming a layer (e.g., silicon nitride), via an in situ radical assisted deposition (iRAD) process, which creates a very conformal layer and a dense film for the liner layer. Techniques other than iRAD may be used to create the liner 112, such as low-pressure chemical vapor deposition.

The interlayer dielectric layer 114 may be a non-crystalline solid material such as silicon dioxide, undoped silicate glass, fluorosilicate glass, borophosphosilicate glass, a spin-on low-k dielectric layer, a chemical vapor deposition low-k dielectric layer or any combination thereof. The term "low-k" as used throughout the present disclosure denotes a dielectric material that has a dielectric constant of less than silicon dioxide. In another embodiment, a self-planarizing material such as a spin-on glass (SoG) or a spin-on low-k dielectric material can be used as the interlayer dielectric layer 114. The use of a self-planarizing dielectric material as the interlayer dielectric layer 114 may avoid the need to perform a subsequent planarizing step.

In some embodiments, the interlayer dielectric layer 114 can be formed on exposed surfaces of the liner 112 utilizing a deposition process including, for example, chemical vapor deposition, plasma enhanced chemical vapor deposition, evaporation, or spin-on coating. In some embodiments, particularly when non-self-planarizing dielectric materials are used as the interlayer dielectric layer 114, a planarization process or an etch back process follows the deposition of the dielectric material that provides the interlayer dielectric layer 114.

Figure 3:
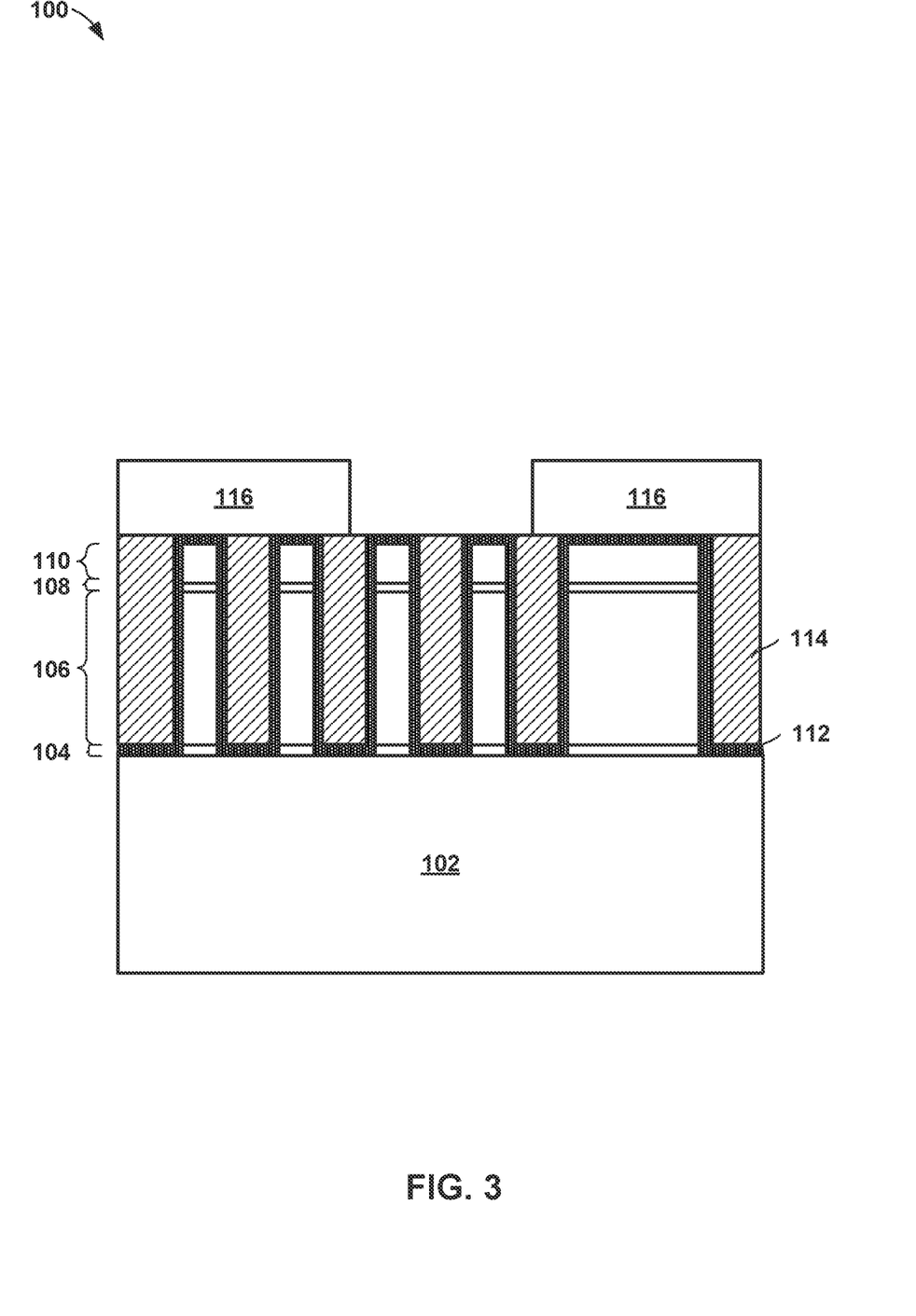
FIG. 3 depicts a cross-sectional view of a process of deposition of hardmask on top of the ILD layer, according to at least one embodiment.

Referring now to FIG. 3, a fabrication step of the integrated circuit structure 100, in accordance with one or more embodiments, is depicted. FIG. 3 depicts deposition of a hardmask 116 on top of the interlayer dielectric layer 114. The hardmask 116 may be an organic planarization layer or any other type of hardmask layer. For example, the hardmask 116 may be composed of metal or a dielectric material such as, for example, such as, for example, a low-k dielectric, a nitride, silicon nitride, silicon oxide, silicon oxynitride, silicon carbide, silicon oxycarbonitride, or silicoboron carbonitride. In some embodiments of this disclosure, the hardmask 116 is a silicon nitride or silicon oxide hardmask. In some embodiments of this disclosure, the hardmask 116 is formed to a thickness of about 40 nm to about 600 nm, for example 60 nm, although other thicknesses are within the contemplated scope of this disclosure. The hardmask 116 may be deposited using, for example, any suitable process, such as chemical vapor deposition, plasma enhanced chemical vapor deposition, ultrahigh vacuum chemical vapor deposition, rapid thermal chemical vapor deposition, metalorganic chemical vapor deposition, low-pressure chemical vapor deposition, limited reaction processing chemical vapor deposition, atomic layer deposition, flowable chemical vapor deposition, spin-on dielectrics, physical vapor deposition, molecular beam epitaxy, chemical solution deposition, spin-on dielectrics, or other like process.

The hardmask 116 may subsequently be patterned using a photoresist (not shown) via an etching process such that the portions of the hardmask 116 remain over one or more desired vias. A photoresist is a light-sensitive material used in processes, such as photolithography, to form a patterned coating on a surface. The photoresist may be a light-sensitive polymer. The desired hardmask pattern for the hardmask 116 may be formed by removing the areas not protected by the pattern in the photoresist. The hardmask 116 is removed using, for example, reactive ion etching. Reactive ion etching uses chemically reactive plasma, generated by an electromagnetic field, to remove various materials. A person of ordinary skill in the art will recognize that the type of plasma used will depend on the material of which the hardmask 116 is composed, or that other etch processes such as wet chemical etching or laser ablation may be used. In general, the hardmask 116 is patterned such that the hardmask 116 exposes one or more of the metal lines that coincide with a desired location for one or more dummy lines.

Figure 4:
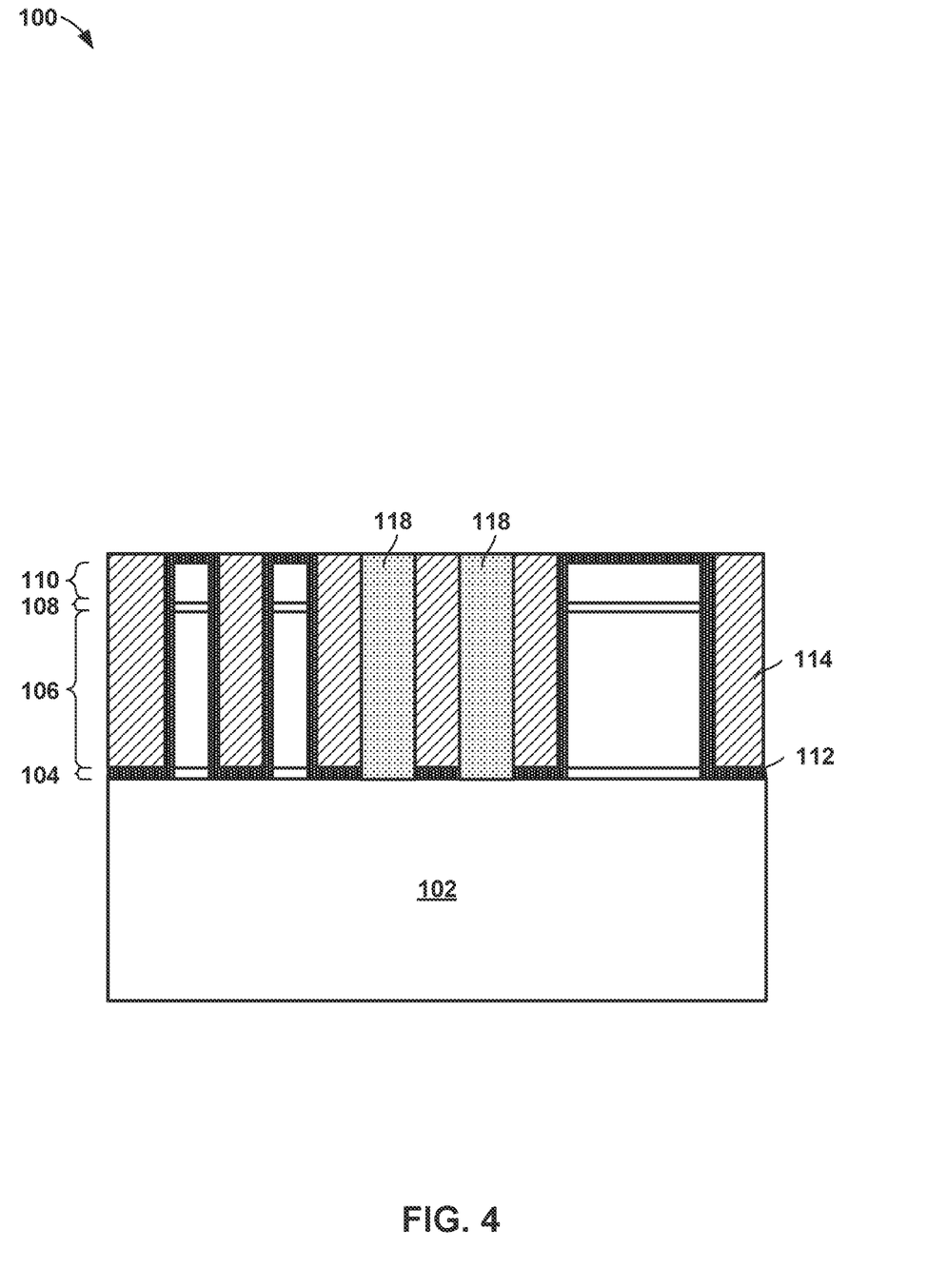
FIG. 4 depicts a cross-sectional view of a process of etching and removing one or more exposed metal lines, according to at least one embodiment.

Referring now to FIG. 4, a fabrication step of the integrated circuit structure 100, in accordance with one or more embodiments, is depicted. FIG. 4 depicts etching and removing the one or more exposed metal lines to form one or more openings that may be filled with a dielectric material 118, such that pillars of the dielectric material 118 are formed. The dielectric material 118 may include, among other things, silicon nitrides (SiN), silicon carbonate ($SiCO_4$), silicon carbide (SiC), aluminum oxides (AlOx), or aluminum nitrides (AlNx). The dielectric material 118 may be deposited using an atomic layer deposition process. The deposition of the dielectric material 118 may increase the density of features across the integrated circuit structure 100 such that the feature density may be considered more uniform than if dielectric material 118 remained the interlayer dielectric layer 114. That is, the spacing between the one or more metal lines and the one or more dielectric pillars is uniform or substantially uniform such that there are no large regions of the integrated circuit structure 100 that lack features, such as metal lines and vias.

Figure 5:
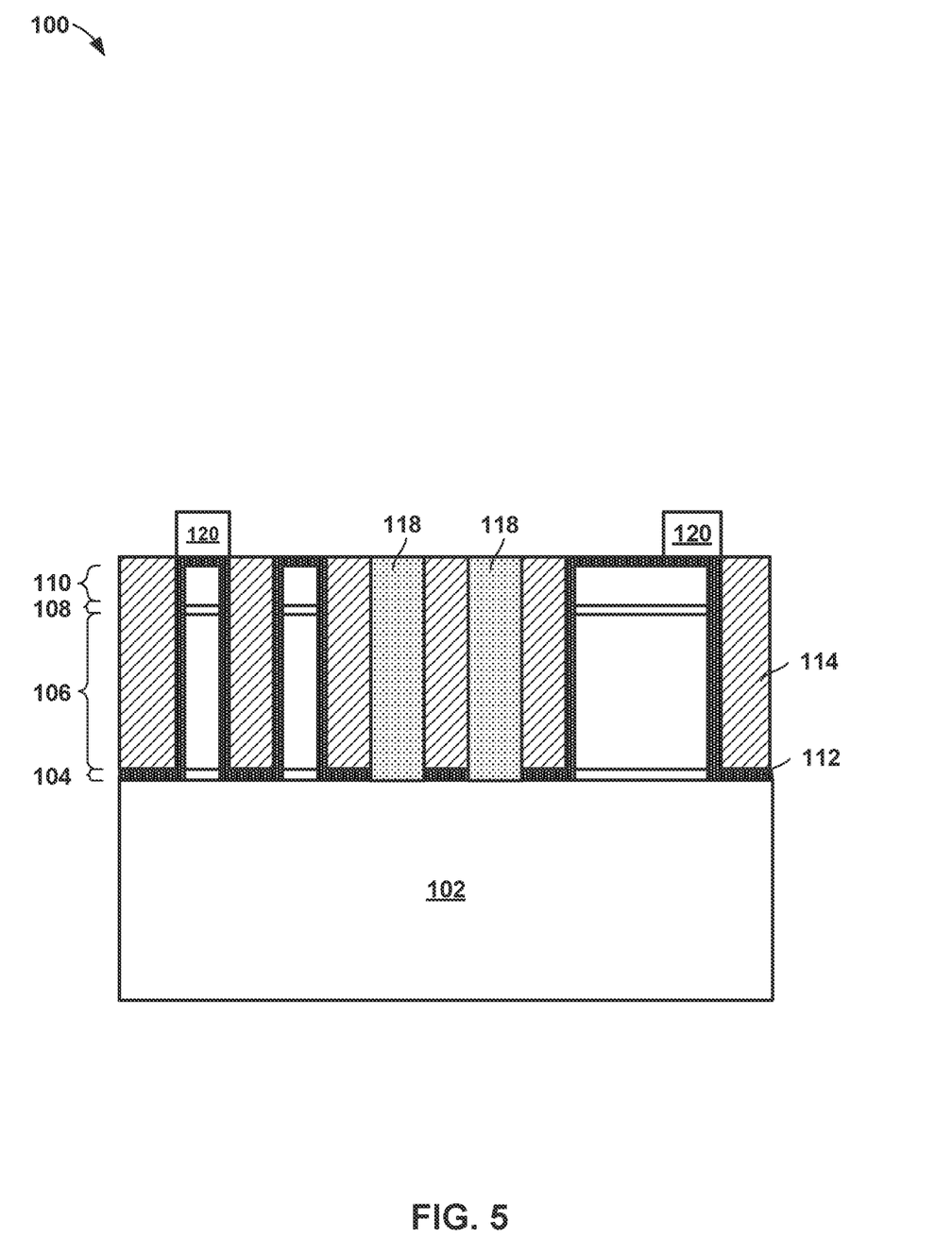
FIG. 5 depicts a cross-sectional view of a process of formation and patterning of a hardmask, according to at least one embodiment.

Referring now to FIG. 5, a fabrication step of the integrated circuit structure 100, in accordance with one or more embodiments, is depicted. FIG. 5 depicts the formation and patterning of a hardmask 120. The hardmask 120 may be patterned using a photoresist (not shown) to expose areas of the interlayer dielectric layer 114 and metal lines that do not correspond to desired via locations. The hardmask 120 is removed using, for example, reactive ion etching or any other suitable etching process.

Figure 6:
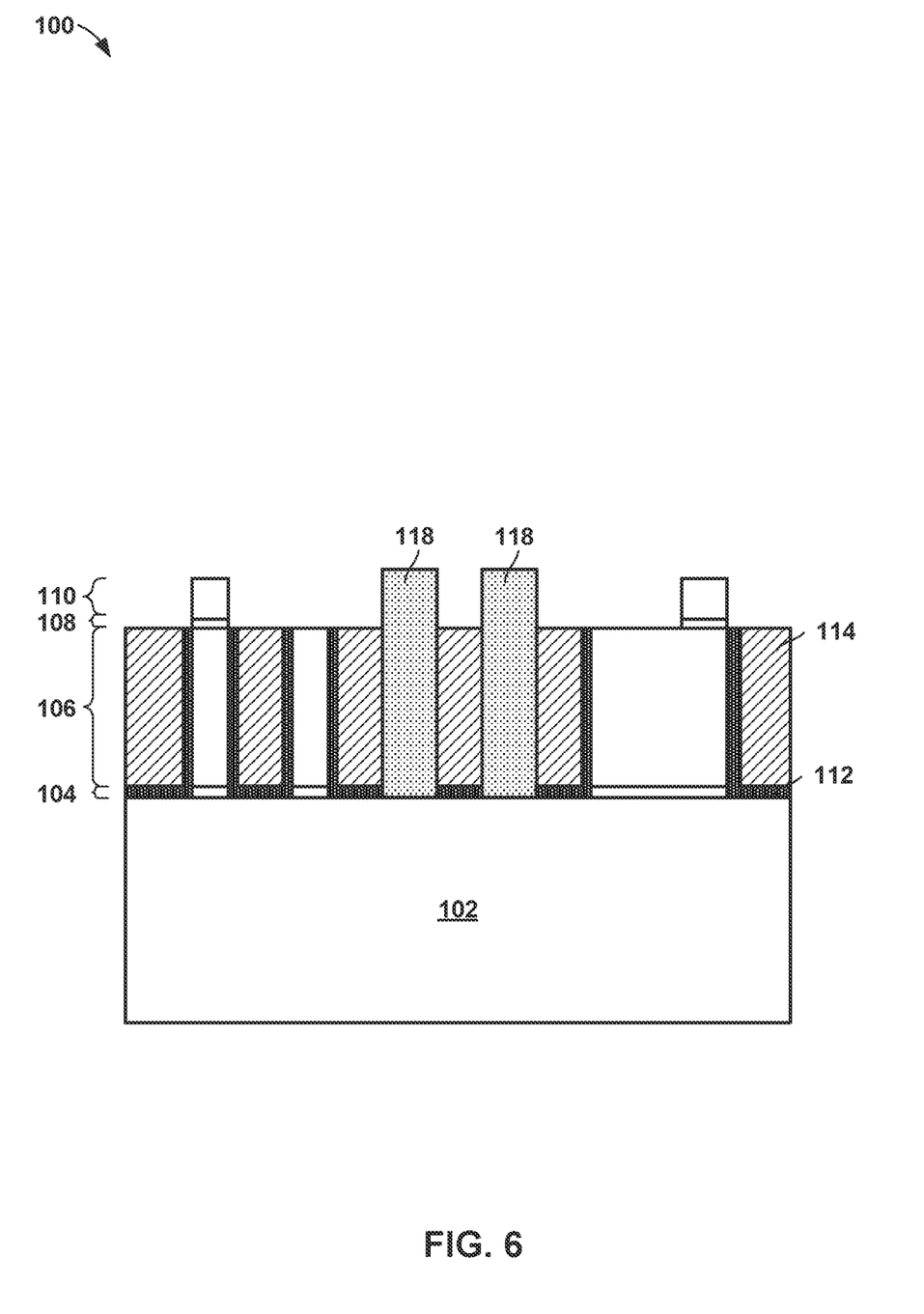
FIG. 6 depicts a cross-sectional view of an etch process utilized in via formation, according to at least one embodiment.

Referring now to FIG. 6, a fabrication step of the integrated circuit structure 100, in accordance with one or more embodiments, is depicted. FIG. 6 depicts an etch process utilized in via formation. An etching process, such as reactive ion etching, laser ablation, or any etch process which can be used to selectively remove a portion of material such as the interlayer dielectric layer 114, the hardmask 110, the etch stop liner 108, and the liner 112 may be utilized. The etching process only removes the portions of the interlayer dielectric layer 114, the hardmask 110, the etch stop liner 108, and the liner 112 not protected by the hardmask 120.

Figure 7:
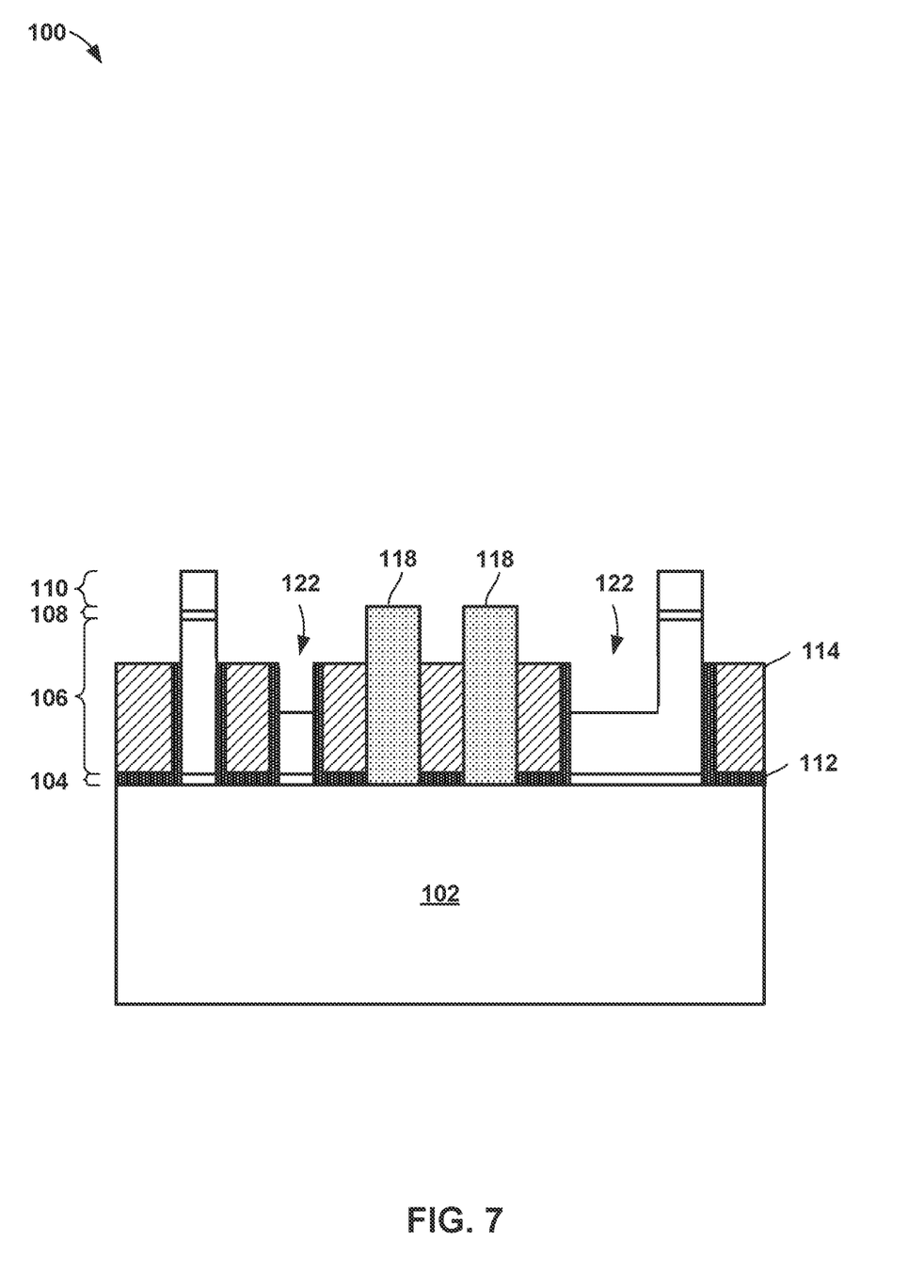
FIG. 7 depicts a cross-sectional view of a process of etching of the metal layer, the liner, and the ILD layer, according to at least one embodiment.

Referring now to FIG. 7, a fabrication step of the integrated circuit structure 100, in accordance with one or more embodiments, is depicted. FIG. 7 depicts etching of the metal layer 106, the liner 112, and the interlayer dielectric layer 114. The metal layer 106 may be recessed in one or more areas 122 where the metal layer 106 is not covered by the etch stop liner 108 and the hardmask 110. Recessing of the metal layer 106 may involve the use of an etching process such as reactive ion etching, laser ablation, or any etch process which can be used to selectively remove a portion of material.

Figure 8:
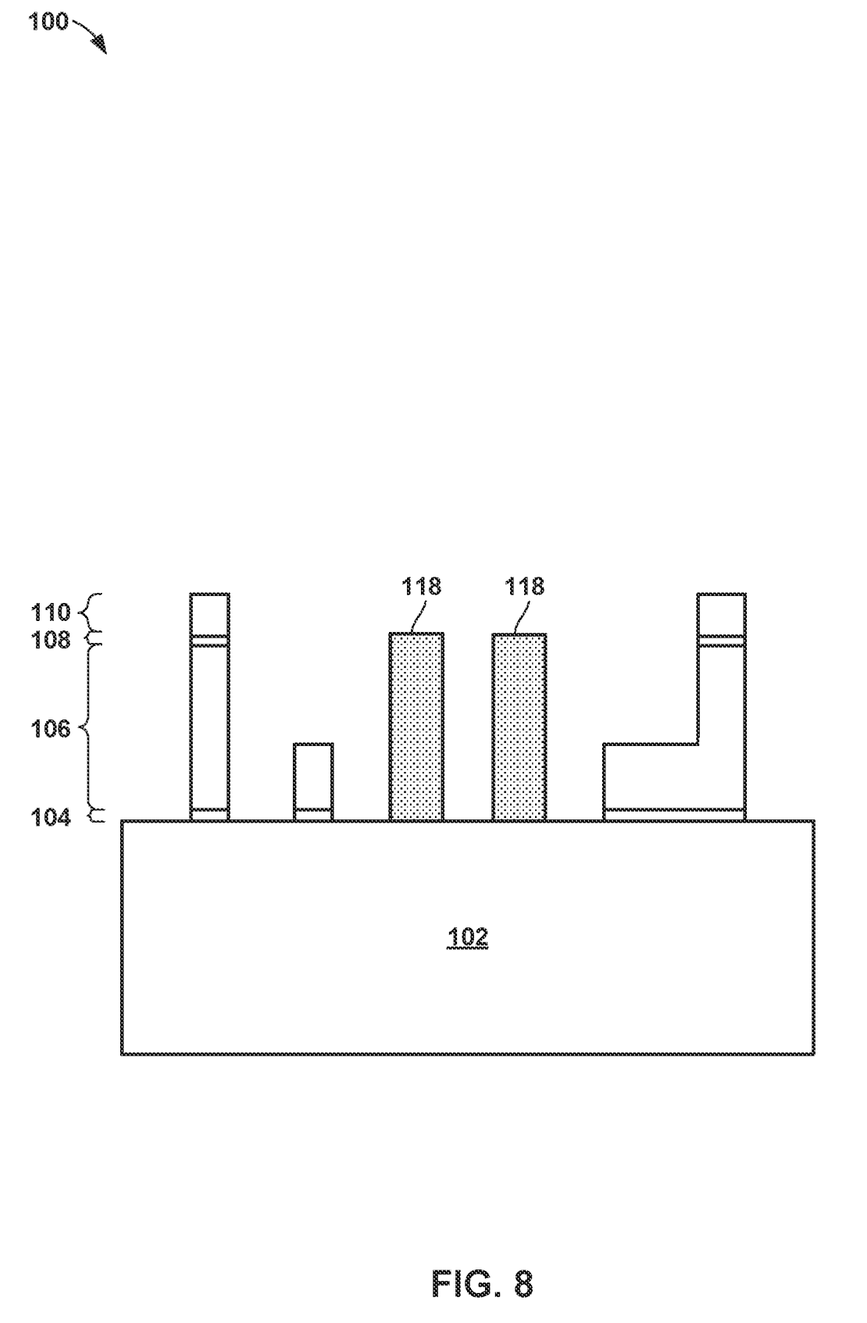
FIG. 8 depicts a cross-sectional view of a process of removal of the liner and the ILD layer, according to at least one embodiment.

Referring now to FIG. 8, a fabrication step of the integrated circuit structure 100, in accordance with one or more embodiments, is depicted. FIG. 8 depicts removal of the liner 112 and the interlayer dielectric layer 114. The process of removing the interlayer dielectric layer 114 may involve the use of an etching process such as reactive ion etching, laser ablation, or any etch process which can be used to selectively remove a portion of material. In general, during such an etch process, the etch stop liner 108, the hardmask 110, and the liner 112 act to protect metal lines during the removal of the interlayer dielectric layer 114. The subsequent process of removing the liner 112 may involve the use of an etching process such as reactive ion etching, laser ablation, or any etch process which can be used to selectively remove a portion of material.

Figure 9:
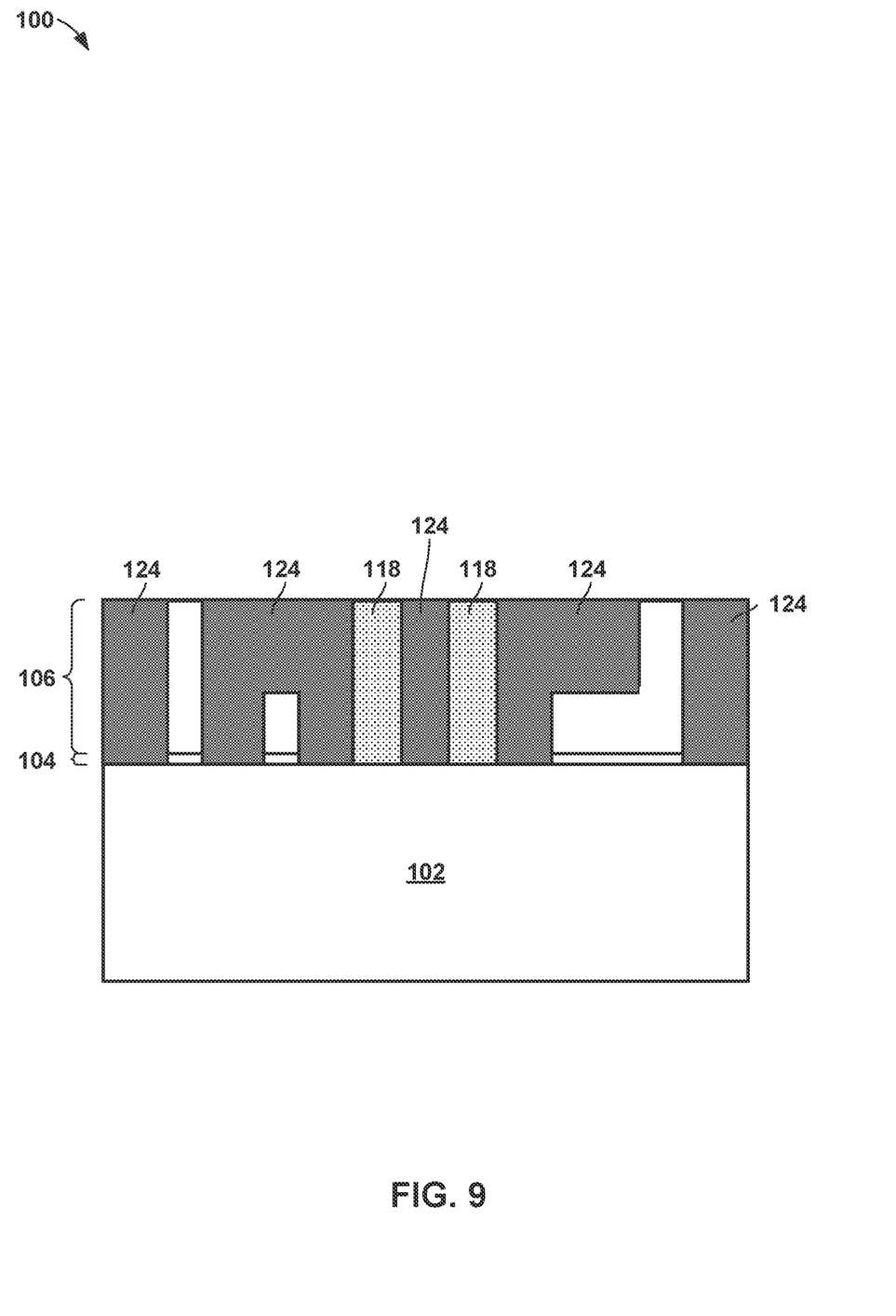
FIG. 9 depicts a cross-sectional view of a process of formation of an ultra-low-k layer, according to at least one embodiment.

Referring now to FIG. 9, a fabrication step of the integrated circuit structure 100, in accordance with one or more embodiments, is depicted. FIG. 9 depicts formation of a dielectric layer 124. The dielectric layer 124 is generally a layer of ultra-low-k dielectric material. Low-k material is a material with a small relative dielectric constant (k) relative to silicon dioxide. Low-k materials include, for example, SiCOH, fluorine-doped silicon dioxide, organosilicate glass, porous silicon dioxide, porous organosilicate glass, spin-on organic polymeric dielectrics, and spin-on silicon based polymeric dielectrics. In some embodiments, the dielectric layer 124 is spin-on-glass. Spin-on-glass is an interlayer dielectric material applied in liquid form to fill narrow gaps in the sub-dielectric surface. In some embodiments, the dielectric layer 124 is deposited using flowable chemical vapor deposition or spin-on dielectric methods.

The dielectric layer 124 may be in direct contact with side surfaces of the metal lines and vias formed from the metal layer 106 and of the dielectric material 118. The dielectric layer 124 may be deposited above a desired height. In embodiments where the dielectric layer 124 is deposited above the desired height, a subsequent polishing process, such as chemical-mechanical planarization, may be utilized to reduce the height of a top surface of the dielectric layer 124 to be equal or substantially equal to the height of the top surfaces of the metal layer 106 and the dielectric material 118. That is, after polishing, the top surfaces of the dielectric layer 124, the metal layer 106, and the dielectric material 118 may be flush or substantially flush, with top surfaces of the metal layer 106 and the dielectric material 118 exposed. It may be appreciated that the dummy lines of the dielectric material 118 may allow for a substantially flat surface of the dielectric layer 124 after chemical-mechanical planarization. This may occur by ensuring an increased density of features (e.g., lines and vias) across the integrated circuit structure 100. Thus, the top surface of the one or more vias and the one or more dielectric pillars may act as a chemical-mechanical planarization stop to allow for a substantially flatter surface than if there were no dielectric pillars.

As previously described chemical-mechanical planarization may cause surface defects for ultra-low-k layers, such as a non-flat top surface of the dielectric layer 124. Thus, the chemical-mechanical planarization process may remove more material than is desired in low density areas that do not have lines or vias, which may result in a non-flat surface top surface of the dielectric layer 124. By increasing the density of features within the integrated circuit structure 100 such that spacing of the features is uniform or substantially uniform, the top surface of the dielectric layer 124 may be relatively flat as compared to the top surface of the dielectric layer 124 without the dielectric pillars.

Figure 10:
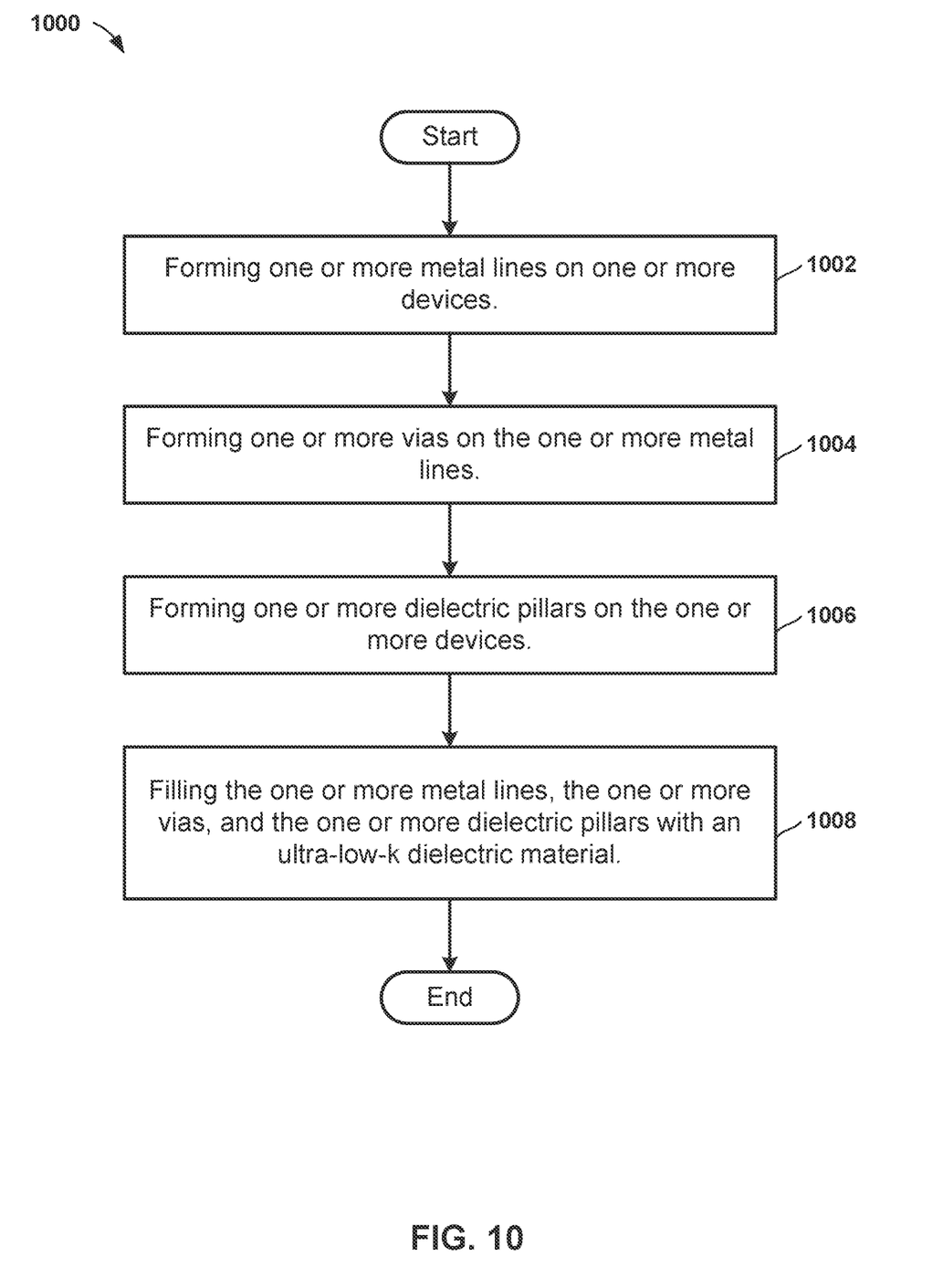
FIG. 10 depicts an operational flowchart illustrating the steps of fabricating an interconnect device, according to at least one embodiment.

Referring now to FIG. 10, an operational flowchart illustrating the steps of a method 1000 for forming an interconnect structure is depicted.

At 1002, the method 1000 may include forming one or more metal lines on one or more devices.

At 1004, the method 1000 may include forming one or more vias on the one or more metal lines.

At 1006, the method 1000 may include forming one or more dielectric pillars on the one or more devices.

At 1008, the method 1000 may include filling the one or more metal lines, the one or more vias, and the one or more dielectric pillars with an ultra-low-k dielectric material.

It may be appreciated that FIG. 10 provides only an illustration of one implementation and does not imply any limitations with regard to how different embodiments may be implemented. Many modifications may be made based on design and implementation requirements.

The resulting structure described above is a BEOL metal line and via interconnect structure that includes metal lines and vias with a dummy vias throughout the structure. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
    one or more metal lines in direct contact with a top surface of one or more devices;
    one or more vias in direct contact with top surfaces of the one or more metal lines; and
    one or more dielectric pillars in direct contact with the top surface of the one or more devices, wherein a height of a top surface of the one or more dielectric pillars above the one or more device is equal to a height of a top surface of the one or more vias above the one or more devices, and wherein the top surface of the one or more vias and the top surface of the one or more dielectric pillars are configured to act as a chemical-mechanical planarization stop based on a spacing of the one or more metal lines and the one or more dielectric pillars across the interconnect structure.

2. The interconnect structure of claim 1, wherein the metal line and the one or more vias are composed of a material selected from the group consisting of: ruthenium, cobalt, molybdenum, tungsten, aluminum, and rhodium.

3. The interconnect structure of claim 1, wherein the one or more dielectric pillars are composed of a material selected from the group consisting of: silicon nitride, silicon carbonate, silicon carbide, aluminum oxide, and aluminum nitride.

4. The interconnect structure of claim 1, further comprising:
an ultra-low-k dielectric material in direct contact with side surfaces of the one or more metal lines, side surfaces of the one or more vias, and side surfaces of the one or more dielectric pillars.

5. The interconnect structure of claim 1, wherein the spacing of the one or more metal lines and the one or more dielectric pillars is uniform across the interconnect structure.

6. An interconnect structure comprising:
one or more metal lines;
one or more vias in direct contact with top surfaces of the one or more metal lines;
one or more dielectric pillars, wherein a height of a top surface of the one or more dielectric pillars is equal to a height of a top surface of the one or more vias, and wherein the top surface of the one or more vias and the top surface of the one or more dielectric pillars are configured to act as a chemical-mechanical planarization stop based on a spacing of the one or more metal lines and the one or more dielectric pillars across the interconnect structure; and
an ultra-low-k dielectric material in direct contact with side surfaces of the one or more metal lines, side surfaces of the one or more vias, and side surfaces of the one or more dielectric pillars.

7. The interconnect structure of claim 6, wherein the one or more metal lines and the one or more vias are composed of a material selected from the group consisting of: ruthenium, cobalt, molybdenum, tungsten, aluminum, and rhodium.

8. The interconnect structure of claim 7, wherein the one or more metal lines and the one or more vias are composed of a same material.

9. The interconnect structure of claim 6, wherein the dielectric pillars are composed of a material selected from the group consisting of: silicon nitride, silicon carbonate, silicon carbide, aluminum oxide, and aluminum nitride.

10. The interconnect structure of claim 6, wherein the spacing of the one or more metal lines and the one or more dielectric pillars is uniform across the interconnect structure.

* * * * *